United States Patent [19]
Kook et al.

[11] Patent Number: 5,326,727
[45] Date of Patent: Jul. 5, 1994

[54] METHOD FOR INTEGRATED CIRCUIT FABRICATION INCLUDING LINEWIDTH CONTROL DURING ETCHING

[75] Inventors: Taeho Kook, Lower Macungie Township, Lehigh County, Pa.; Avinoam Kornblit, Highland Park, N.J.; Kolawole R. Olasupo, Kutztown, Pa.

[73] Assignee: AT&T Bell Laboratories, Murray Hill, N.J.

[21] Appl. No.: 998,503

[22] Filed: Dec. 30, 1992

[51] Int. Cl.[5] .............................. H01L 21/31
[52] U.S. Cl. .................... 437/229; 437/228; 156/643; 156/657; 156/659.1; 156/661.1
[58] Field of Search ............ 156/659.1, 643, 661.1, 156/653, 657, 660; 437/228, 229

[56] References Cited

U.S. PATENT DOCUMENTS

| | | | |
|---|---|---|---|
| 4,244,799 | 1/1981 | Fraser et al. | 204/192 |
| 4,521,274 | 6/1985 | Reichmanis et al. | 156/643 |
| 4,615,782 | 10/1986 | Namatsu et al. | 204/192.36 |
| 4,657,629 | 4/1987 | Bigelow et al. | 156/643 |
| 4,770,739 | 9/1988 | Orvek et al. | 156/643 |
| 4,812,200 | 3/1989 | Birkle et al. | 156/643 |
| 5,126,231 | 6/1992 | Levy | 430/313 |

Primary Examiner—T. N. Quach
Attorney, Agent, or Firm—Richard D. Laumann

[57] ABSTRACT

Pattern transfer from a resist to an underlying layer is accomplished by etching the underlying layer in a plasma comprising hydrogen bromide and oxygen. Accuracy of pattern transfer is obtained by using first and second materials underneath the resist. The first and second materials may be, e.g., polysilicon and a photoresist. Etching of the resist is performed under conditions designed to minimize changes in the horizontal dimensions.

9 Claims, 1 Drawing Sheet

METHOD FOR INTEGRATED CIRCUIT FABRICATION INCLUDING LINEWIDTH CONTROL DURING ETCHING

TECHNICAL FIELD

This invention relates to a method of semiconductor fabrication which controls the linewidth of structures, which include a layer of resist, by controlling etching conditions to minimize changes in the horizontal dimensions of the resist.

BACKGROUND OF THE INVENTION

Integrated circuit fabrication sequences typically have a plurality of pattern delineation steps. In such steps, the substrate is coated with a radiation sensitive material, commonly termed a resist, and selected portions of the resist are exposed to radiation which induces reactions within the resist that yield to differential removal rates between the exposed and unexposed portions of the resist. After portions of the resist have been removed, the now exposed portions of the underlying substrate are removed by etching. Various materials, such as an organic antireflection coating, silicon dioxide, silicide, polysilicon, and metal may be part of the substrate underneath the resist. If present, the antireflection coating may also have a planarizing function.

The pattern is typically transferred from a mask to the resist by exposing selected portions of the resist to radiation which passes through portions of the mask. The transfer must be accurate, but unfortunately, it is a function of many parameters including resist thickness. Variations in parameters such as resist thickness and substrate reflectivity tend to create resist images that differ from the intended size. Variations that might be tolerated at 1.25 $\mu$m device dimensions become unacceptable at 0.35 $\mu$m device dimensions. For example, a 0.1 $\mu$m variation in field effect transistor gate width may be acceptable for channel lengths of 1.25 $\mu$m but will be unacceptable for channel lengths of 0.35 $\mu$m.

In attempts to insure accurate pattern transfer from mask to substrate, multilayer resists have been developed. See, for example, U.S. Pat. No. 4,244,799 issued on Jan. 13, 1981 for a description of a trilayer structure. See, for example, U.S. Pat. Nos. 4,521,274 issued on Jun. 4, 1985 to Reichmanis et al. and 4,657,629 issued on Apr. 14, 1987 to Bigelow for descriptions of bilayer structures. Of course, accurate exposure of the resist is not sufficient for accurate pattern transfer into the planarizing layer; the planarizing layer must also be accurately etched. This is not a trivial endeavor for small features; the resist must be etched in the vertical direction but not in the horizontal direction. Etching in the horizontal direction will, of course, inevitably lead to a change in feature size.

Additional methods for accurate etching of the planarizing layer under the resist are desirable.

SUMMARY OF THE INVENTION

According to one embodiment of this invention, integrated circuits are fabricated with accurately determined dimensions by forming a layer of first material on a substrate; covering the first material with a second material which planarizes the surface and reduces reflections; covering the layer of second material with a resist; selectively exposing portions of the resist to radiation; developing the resist to expose portions of the second material and etching the second material in a plasma comprising oxygen and one member selected from the group consisting of halogens and halogen hydrides. The oxygen and the halogen hydride have concentrations selected to minimize changes in the horizontal dimensions of the resist. The second material is typically a polymer such as a photoresist. The second material may be exposed to ultraviolet radiation or baked at an elevated temperature so that it does not mix with the subsequently applied resist and become inert to the exposure and development steps that one used for resist patterning. The plasma may further comprise an inert constituent such as helium. In a typical embodiment, the first material comprises polysilicon and is etched after the planarizing layer is etched. In an exemplary embodiment, the halogen hydride is hydrogen bromide. In yet another preferred embodiment, the concentration of the hydrogen bromide to the oxygen is approximately 1:1.

BRIEF DESCRIPTION OF THE DRAWING

For reasons of clarity, the elements depicted are not drawn to scale. Identical numerals represent identical elements in different figures.

DETAILED DESCRIPTION

The invention will be described by reference to a particular embodiment. Variations of this embodiment will be apparent to those skilled in the art after consideration of the following.

Figure 1:
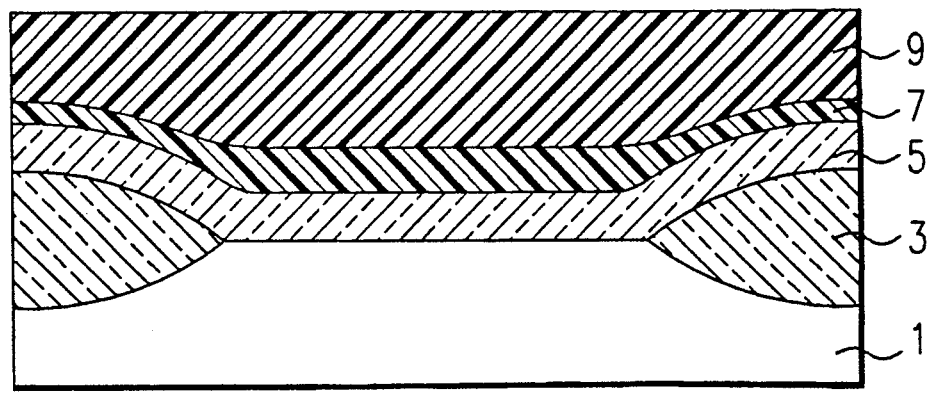
FIGS. 1-3 are sectional views of portions of an integrated circuit at several stages of fabrication according to this invention.

Shown in FIG. 1 are substrate 1, field oxide regions 3, polysilicon layer 5, planarizing layer 7, and resist 9. The elements depicted will be readily fabricated by those skilled in the art, and only several words of explanation about fabrication are required. The substrate 1 will typically be single crystal silicon although other materials are possible. More generally, the term substrate 1 is used to mean any material that lies underneath and supports another material. The substrate 1 may have features, not shown, such as regions of different conductivity types that form source/drain regions of field effect transistors. The field oxide regions 3 are formed by well known and conventional processes. The planarizing layer 7 comprises a material, frequently an organic polymer, that reduces reflections of the radiation used in the selective exposure of the resist 9. The layer does not produce complete planarity. The layer may be exposed to ultraviolet radiation or baked at an elevated temperature to prevent mixing with the subsequently deposited resist. Appropriate materials and thicknesses will be readily selected. The resist is deposited using conventional techniques.

Figure 2:
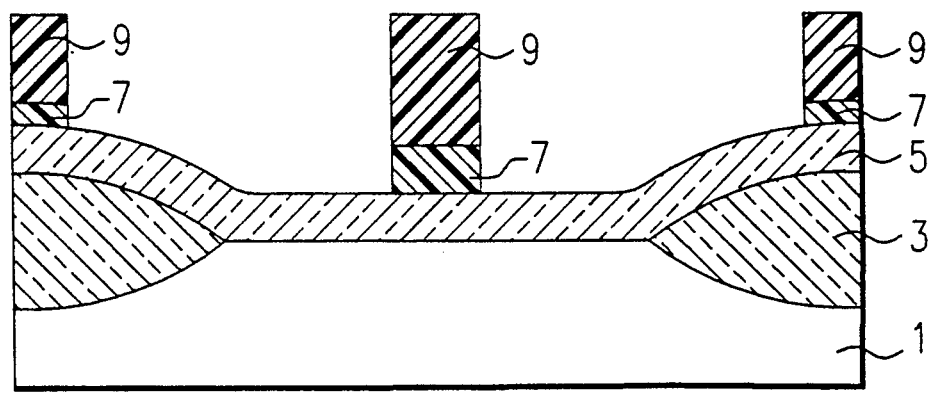

Selected portions of the resist are now exposed to radiation, and portions of the resist removed by standard development techniques to pattern the resist. The pattern is then transferred to the planarizing layer by etching. FIG. 2 shows the structure after the resist and the underlying planarizing layer have been patterned by etching. The etching conditions used for the planarizing layer are critical in maintaining dimensional control. The plasma used has at least one member selected from the group consisting of halogens and halogen hydrides; and oxygen. The member, e.g., halogen hydride, and the oxygen have concentrations selected to minimize changes in the dimensions of the resist. There may be an inert species present as well. In a preferred embodiment, the halogen hydride is hydrogen bromide. Hydrogen chloride, chlorine or bromine may also be used. In another preferred embodiment, the inert species is helium.

The ratio of the halogen hydride to oxygen is set to a determined value to insure accurate pattern transfer. It was found that a ratio of hydrogen bromide to oxygen of approximately 1:1 produced good results at a plasma pressure approximately 25 mTorr or less. It is believed that there is competition between a polymer buildup on the sidewalls of the resist and sputtering; the proper ration of hydrogen bromide to oxygen insures a balance between these two competing processes.

Figure 3:
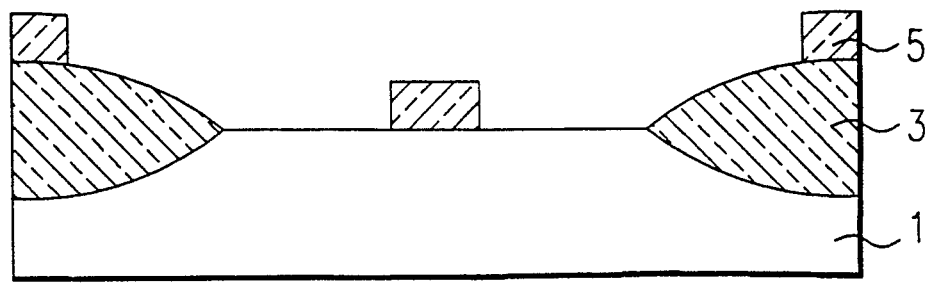

The etch chemistry is now changed to a chemistry for etching the polysilicon. A typical plasma uses, as is well known, chlorine. The hydrogen halide containing plasma may also be used to etch the polysilicon. Appropriate pressures will be readily selected by those skilled in the art. The resulting structure is depicted in FIG. 3. The resist and the planarizing layer may now be stripped to leave the patterned polysilicon which is used to form gate structures or interconnects between devices.

Variations in the embodiment described will be readily thought of by those skilled in the art. Thus, the polysilicon layer 5 and the planarizing layer 7 may comprise first and second materials, respectively.

We claim:

1. A method of integrated circuit fabrication comprising the steps of:
    forming a layer of first material on a substrate;
    covering said layer of first material with a layer of second material of photoresist, said second layer being a planarizing layer;
    covering said layer of second material with a resist, said second material reducing reflections of radiation used in the selective exposure of said resist;
    selectively exposing portions of said resist to radiation;
    etching said planarizing layer in a plasma comprising oxygen and at least one member selected from the group consisting of halogens and halogen hydrides, said at least one member and said oxygen having concentrations selected to minimize changes in the dimensions of the resist during etching which exposes portions of said material.

2. A method as recited in claim 1 in which said plasma further comprises an inert constituent.

3. A method as recited in claim 2 in which said inert constituent comprises helium.

4. A method as recited in claim 1 in which said first material comprises polysilicon.

5. A method as recited in claim 4 comprising the further step of etching said polysilicon.

6. A method as recited in claim 1 in which said at least one member is selected from the group consisting of hydrogen halides.

7. A method as recited in claim 6 in which said halogen hydride is hydrogen bromide.

8. A method as recited in claim 7 in which the concentration of said hydrogen bromide to said oxygen is approximately 1:1.

9. A method as recited in claim 8 in which said plasma has a pressure of approximately 25 mTorr or less.

* * * * *